(12) United States Patent
Xu et al.

(10) Patent No.: US 10,756,205 B1
(45) Date of Patent: Aug. 25, 2020

(54) DOUBLE GATE TWO-DIMENSIONAL MATERIAL TRANSISTOR

(71) Applicant: International Business Machines Corporation, Armonk, NY (US)

(72) Inventors: Peng Xu, Santa Clara, CA (US); Chun Wing Yeung, Niskayuna, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/274,398

(22) Filed: Feb. 13, 2019

(51) Int. Cl.
| | |
|---|---|
| *H01L 29/66* | (2006.01) |
| *H01L 29/775* | (2006.01) |
| *H01L 29/423* | (2006.01) |
| *H01L 21/768* | (2006.01) |
| *H01L 29/06* | (2006.01) |
| *H01L 29/40* | (2006.01) |
| *H01L 21/02* | (2006.01) |
| *H01L 21/311* | (2006.01) |
| *H01L 29/786* | (2006.01) |

(52) U.S. Cl.
CPC ........ *H01L 29/775* (2013.01); *H01L 21/0228* (2013.01); *H01L 21/31116* (2013.01); *H01L 21/76897* (2013.01); *H01L 29/0653* (2013.01); *H01L 29/0665* (2013.01); *H01L 29/401* (2013.01); *H01L 29/42364* (2013.01); *H01L 29/66439* (2013.01); *H01L 29/78696* (2013.01)

(58) Field of Classification Search
CPC .............. H01L 29/775; H01L 21/0228; H01L 21/31116; H01L 29/78696; H01L 29/401; H01L 29/0653; H01L 29/0665; H01L 21/76897; H01L 29/66439; H01L 29/42364

See application file for complete search history.

(56) References Cited

U.S. PATENT DOCUMENTS

| | | |
|---|---|---|
| 6,339,002 B1 | 1/2002 | Chan et al. |
| 6,350,675 B1 * | 2/2002 | Chooi ................. H01L 21/0274 257/E21.027 |

(Continued)

OTHER PUBLICATIONS

Wang, L. et al.; "One-Dimensional Electrical Contact to a Two-Dimensional Material", Science, 2013, vol. 342, pp. 614-617.

*Primary Examiner* — Charles D Garber
*Assistant Examiner* — S M Sohel Imtiaz
(74) *Attorney, Agent, or Firm* — Cantor Colburn LLP; Vazken Alexanian

(57) ABSTRACT

A method of fabricating a semiconductor device includes forming a back gate dielectric. A layer of two-dimensional material is transferred onto a surface of the back gate dielectric. A top gate dielectric is deposited and a top gate formed thereon. A first set of spacers is formed around the top gate and exposed portions of the top gate dielectric removed and a second set of spacers formed around the top gate. Exposed portions of the two-dimensional material are removed. A directional etch down of the substrate and a lateral isotropic etch of the substrate are performed and open spaces filled with a dielectric material surrounding the top gate, the back gate dielectric, and the substrate. The dielectric material is etched from the top gate and the back gate dielectric, the second set of spacers removed, and source and drain contact metal deposited. The source and drain contacts the layer.

11 Claims, 13 Drawing Sheets

(56) References Cited

U.S. PATENT DOCUMENTS

| | | |
|---|---|---|
| 6,762,101 B2 | 7/2004 | Chan et al. |
| 7,259,049 B2 | 8/2007 | Chan et al. |
| 8,030,145 B2 | 10/2011 | Chang et al. |
| 8,557,665 B2 | 10/2013 | Cohen et al. |
| 8,623,717 B2 | 1/2014 | Chen et al. |
| 8,803,132 B2 | 8/2014 | Farmer et al. |
| 9,236,483 B2 | 1/2016 | Yang et al. |
| 2003/0020117 A1* | 1/2003 | Lee .................. H01L 21/76264 257/347 |
| 2009/0146181 A1* | 6/2009 | Lai ................. H01L 21/823807 257/190 |
| 2010/0102292 A1 | 4/2010 | Hiura et al. |
| 2010/0320509 A1* | 12/2010 | Knorr ............... H01L 21/76832 257/288 |
| 2011/0309334 A1* | 12/2011 | Chang ................... B82Y 10/00 257/24 |
| 2012/0181510 A1 | 7/2012 | Avouris et al. |
| 2012/0261643 A1 | 10/2012 | Cohen et al. |
| 2014/0217421 A1* | 8/2014 | Zhu .................. H01L 29/66636 257/77 |
| 2015/0162168 A1* | 6/2015 | Oehrlein ........... H01J 37/32146 438/694 |
| 2017/0141207 A1* | 5/2017 | Cheng ............... H01L 29/66742 |
| 2018/0151751 A1* | 5/2018 | Yeh ..................... H01L 21/0228 |
| 2018/0323103 A1* | 11/2018 | Shaviv .............. H01L 21/67184 |
| 2019/0164972 A1* | 5/2019 | Peng .................... H01L 29/778 |

* cited by examiner

DOUBLE GATE TWO-DIMENSIONAL MATERIAL TRANSISTOR

BACKGROUND

The present invention generally relates to fabrication methods and resulting structures for semiconductor devices. More specifically, the present invention relates to fabrication and resulting structures for fabricating a double gate planar two-dimensional material metal oxide semiconductor field effect transistors (MOSFET) with a small overlap capacitance between a back gate and a source/drain contact.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by incorporating n-type or p-type impurities in the layer of semiconductor material. A conventional geometry for MOSFETs is known as a planar device geometry in which the various parts of the MOSFET device are laid down as planes or layers.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

SUMMARY

Embodiments of the present invention are directed to a method for fabricating a semiconductor device. A non-limiting example of the method includes forming a back gate dielectric on a substrate. A layer of two-dimensional material is transferred onto a surface of the back gate dielectric. A top gate dielectric is deposited on the layer of two-dimensional material. A top gate is formed on the top gate dielectric. A first set of spacers is formed around the top gate. Exposed portions of the top gate dielectric are removed and a second set of spacers formed around the top gate. Exposed portions of the two-dimensional material are removed. A directional etch down of the substrate is performed and then a lateral isotropic etch of the substrate is performed. Open spaces are filled with a dielectric material surrounding the top gate, the back gate dielectric, and the substrate. The dielectric material is etched from the top gate and the back gate dielectric. The second set of spacers is removed. A source and drain contact metal is deposited. The source and drain metal contacts an edge of the layer of the two-dimensional material.

Embodiments of the invention are directed to a semiconductor device. A non-limiting example of the semiconductor device includes a back gate dielectric on a directionally etched and laterally etched substrate. A layer of two-dimensional material is disposed on a surface of the back gate dielectric. A top gate dielectric is deposited on the layer of two-dimensional material. A top gate is disposed on the top gate dielectric and spacers formed around the top gate. A dielectric material is disposed around the substrate. A source and drain contact metal contact an edge of the layer of the two-dimensional material.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
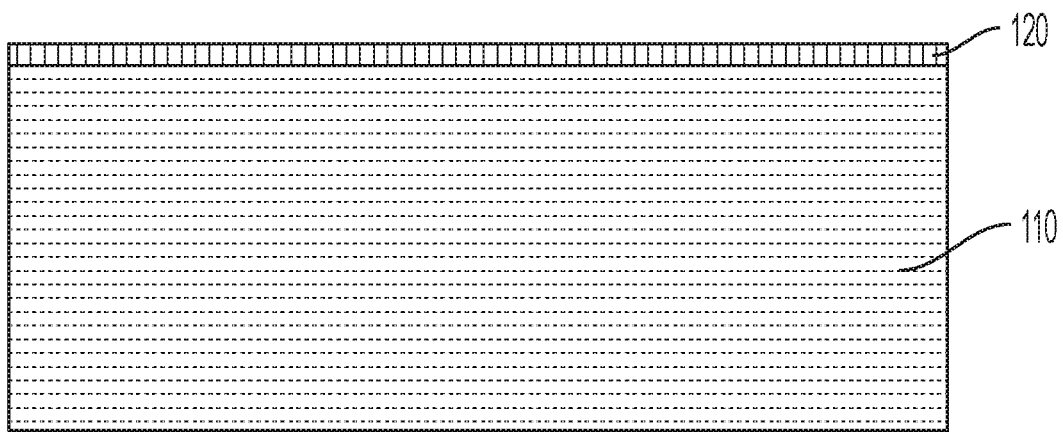
FIG. 1 depicts a cross-sectional view of a semiconductor device after fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, the back gate of a two-dimensional (2D) material FET (e.g., thin film layer) can usually be made by using a highly doped substrate, e.g., a doping concentration greater than $1 \times 10^{19}$ cm$^3$ with a pre-coated gate dielectric. Such a structure, however, leads to very large overlap between gate and source/drain as the whole substrate acts the gate and therefore very large parasitic capacitance between the back gate and the source/drain contact. Parasitic capacitance generally refers to an unavoidable and usually unwanted capacitance existing between the parts of an electronic component or circuit simply because of their proximity to each other. When two electrical conductors at different voltages are close together, the electric field between them causes electric charge to be stored on them. This is called parasitic capacitance. Another approach of forming a back gate is to make a pre-defined buried metal line on the substrate. In this case, however, aligning the top gate to back gate is not possible.

The layer of 2D material can include a monolayer of atoms having a thickness of less than about 1 millimeter (mm). Materials that can qualify as thin films include films with a substantial length and width dimension, but have a very thin thickness dimension.

Turning now to an overview of the aspects of the invention, one or more embodiments of the invention address the above-described shortcomings of the prior art by providing a method for fabricating a semiconductor device. The method can include forming a back gate dielectric on a substrate and transferring a layer of two-dimensional material onto a surface of the back gate dielectric. A top gate dielectric can be deposited on the layer of two-dimensional material thereby forming a top gate on the top gate dielectric. A first set of spacers can be formed around the top gate, exposed portions of the top gate dielectric can be removed, and a second set of spacers can be formed around the top gate. Exposed portions of the two-dimensional material can then be removed and etches performed. A directional etch down of the substrate can be performed and then a lateral isotropic etch of the substrate can be performed so that open spaces can be filled with a dielectric material surrounding the top gate, the bottom gate, and the substrate. At this point, the dielectric material can be etched from the top gate and the bottom gate, the second set of spacers removed, and source and drain contact metals deposited. The source and drain metal contacts an edge of the layer of the two-dimensional material.

The process described herein solves these problems the formation of a double gate planar 2D MOSFET with a small parasitic overlap capacitance between the back gate and the source/drain contacts as the process targets to reduce the direct overlapping area. Additionally, the formed semiconductor device can have reasonable alignment between top and back gates. In the described process and resulting structure, the source/drain contact metal contacts mainly the edge of the 2D material and not the surface. Edge contact to 2D materials can provide improved contact resistivity compared to surface contact.

Turning now to a more detailed description of aspects of the present invention, FIGS. 1 to 12 depict an overview of a process according to embodiments of the invention. In FIG. 1, a back gate dielectric 120 is formed on substrate 110. The substrate 110 can be a highly doped substrate. The substrate 110 can include a conductive substrate or an insulator substrate with a conductive material. The substrate 110 can include silicon, silicon on insulator, silicon dioxide, or a combination thereof. A silicon on insulator substrate can be used if a local back gate is needed. Generally, the substrate 110 can be any conductive substrate or any conductive material sitting on top of an insulator substrate.

Figure 2:
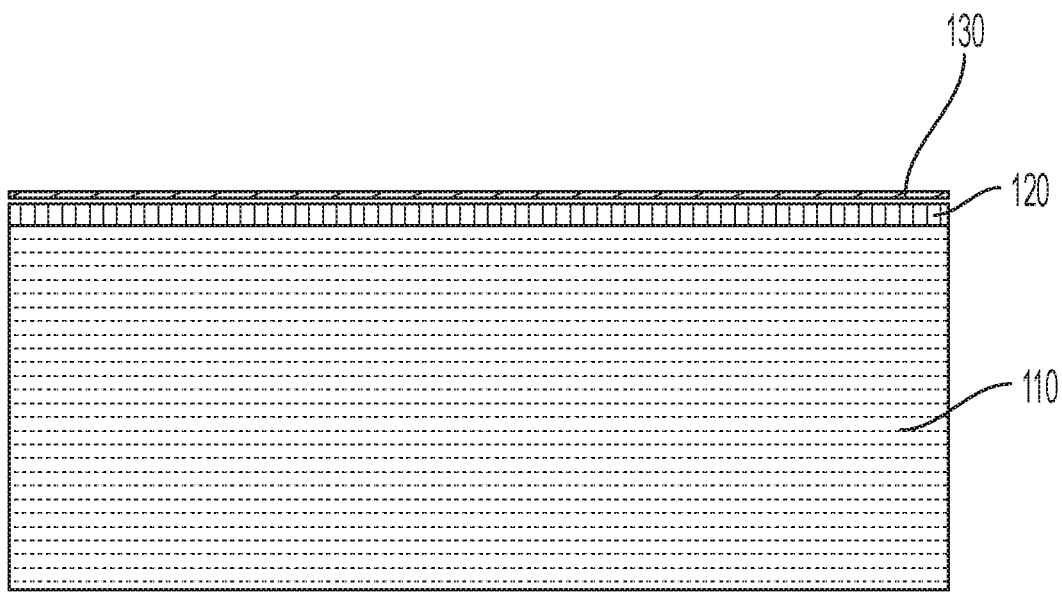
FIG. 2 depicts a cross-sectional view of the semiconductor device after fabrication operations according to embodiments of the invention.

In FIG. 2, a layer of 2D material 130 has been transferred onto a surface of the back gate dielectric 120. 2D materials can include transition metal dichalcogenides (MX$_2$) such as molybdenum disulfide (MoS$_2$), molybdenum diselenide (MoSe$_2$), molybedenum ditelluride (MoTe$_2$), tungsten disulfide (WS$_2$), and tungsten diselenide (WSe$_2$), as well as rhenium disulfide (ReS$_2$), graphene, or a combination including one of the foregoing.

Figure 3:
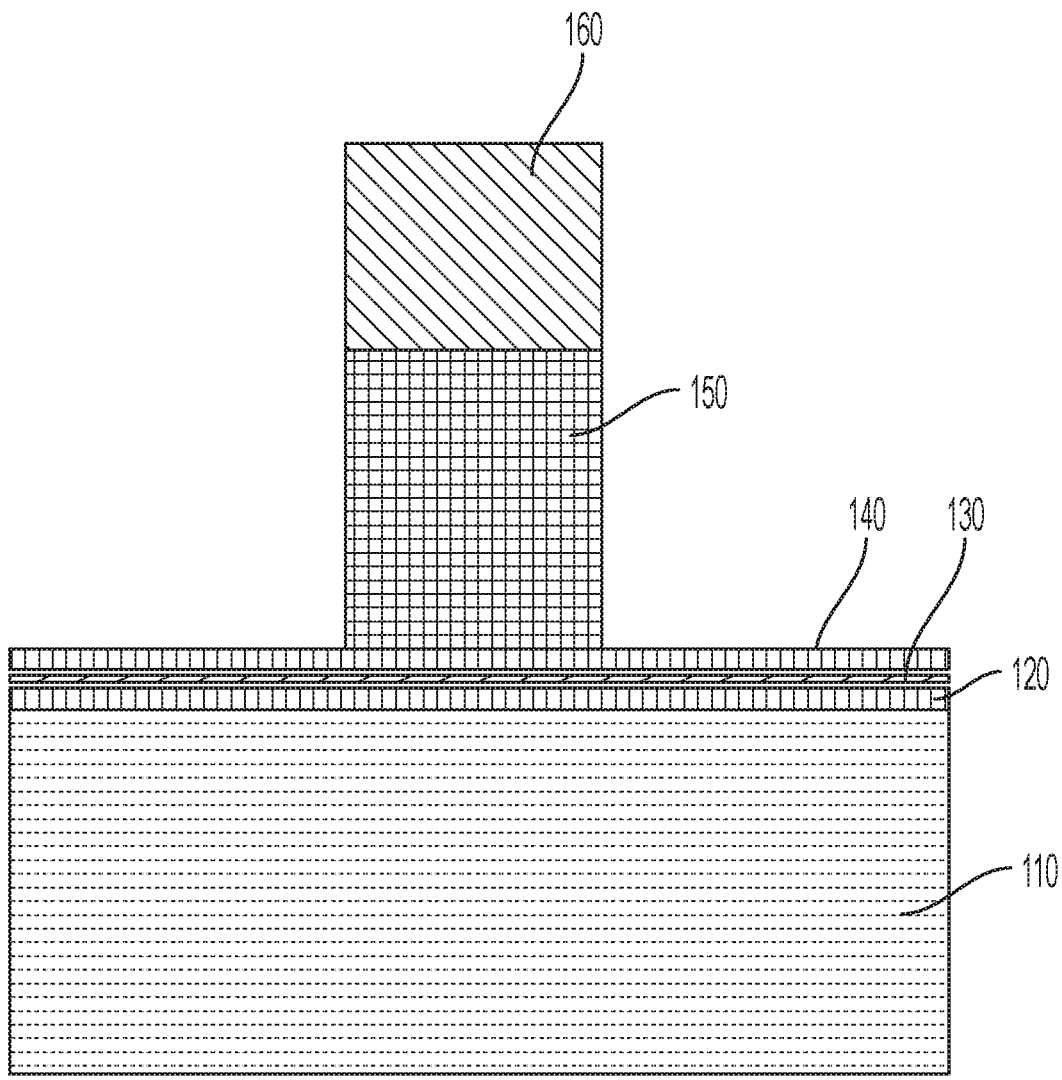
FIG. 3 depicts a cross-sectional view of the semiconductor device after fabrication operations according to embodiments of the invention.

Turning now to FIG. 3, a top gate dielectric 140 has been deposited on the layer of 2D material 130. Afterward, a top gate 150 was formed on the top gate dielectric 140. Optionally, a protective layer 160 can be formed on a surface of the top gate 150. The protective layer 160 can include silicon nitride.

The back gate dielectric 110 and/or the top gate dielectric 140 can include silicon dioxide.

Figure 4:
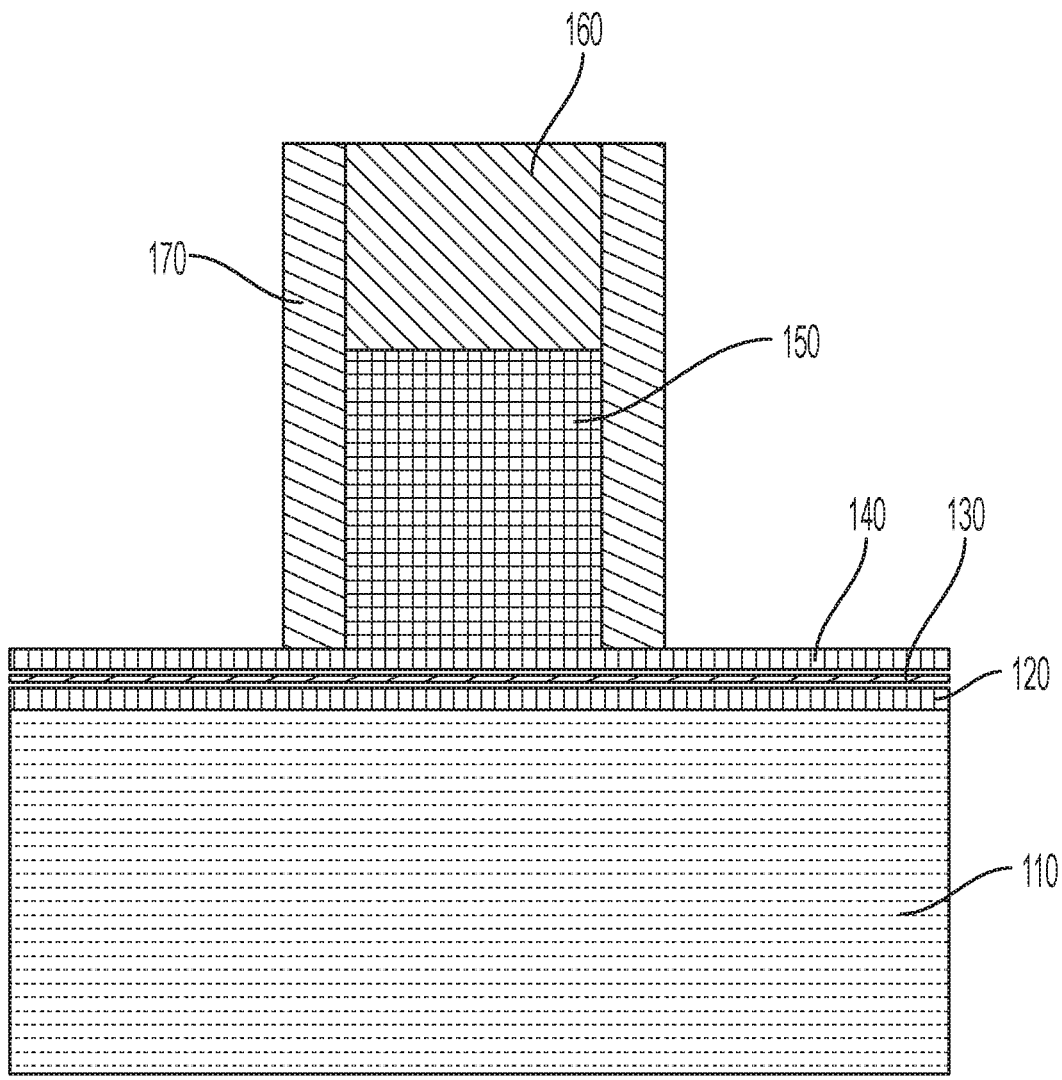
FIG. 4 depicts a cross-sectional view of the semiconductor device after fabrication operations according to embodiments of the invention.

In FIG. 4, a first set of spacers 170 have been formed around the top gate 150 and optional protective layer 160. The spacers can include silicon nitride (SiN), oxide, SiBCN, and/or SiOCN.

Figure 5:
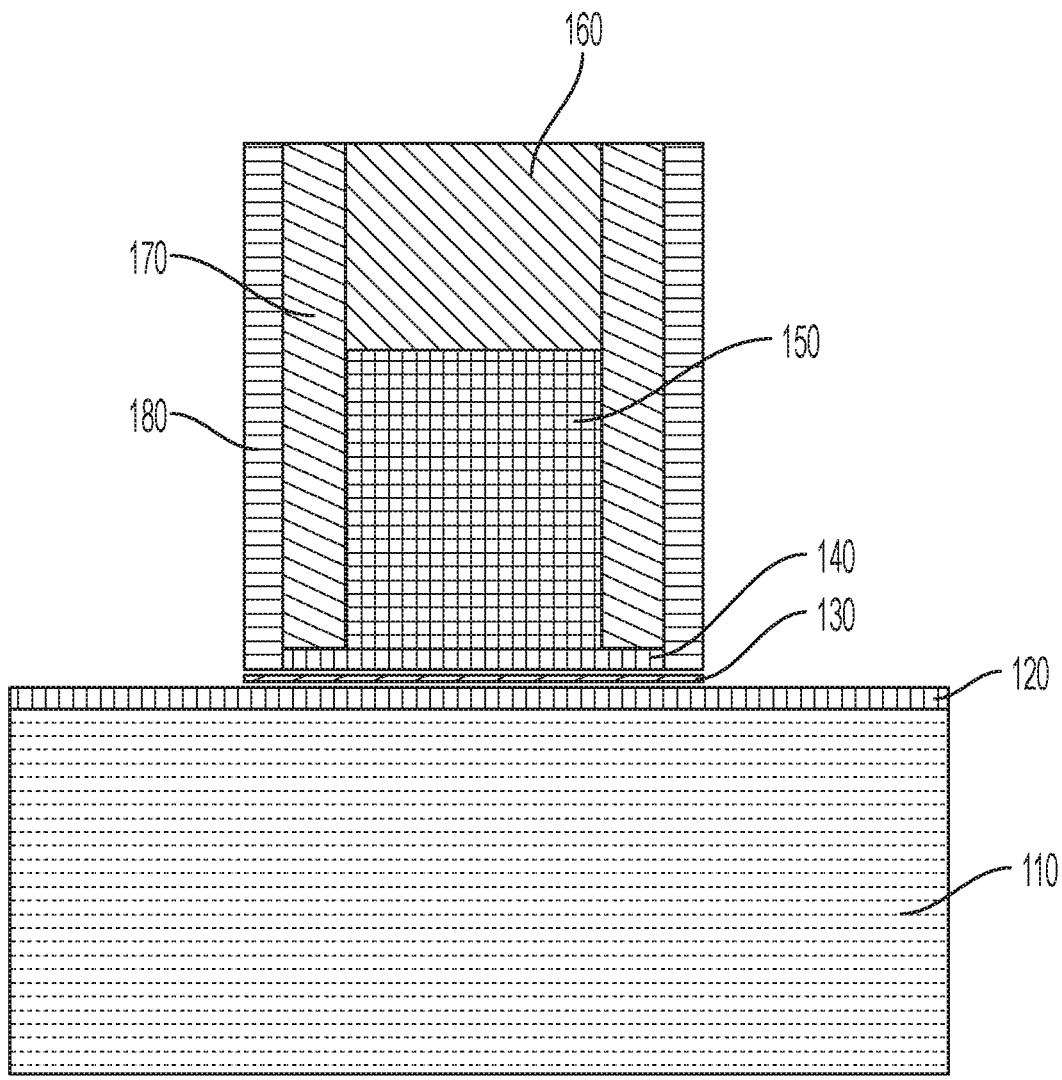
FIG. 5 depicts a cross-sectional view of the semiconductor device after fabrication operations according to embodiments of the invention.

In FIG. 5, exposed portions of the top gate dielectric 140 have been removed after which a second set of spacers 180 have been formed around the top gate 150. After the second sec of spacers 180 is formed, exposed portions of the 2D material layer 130 are removed.

Figure 6:
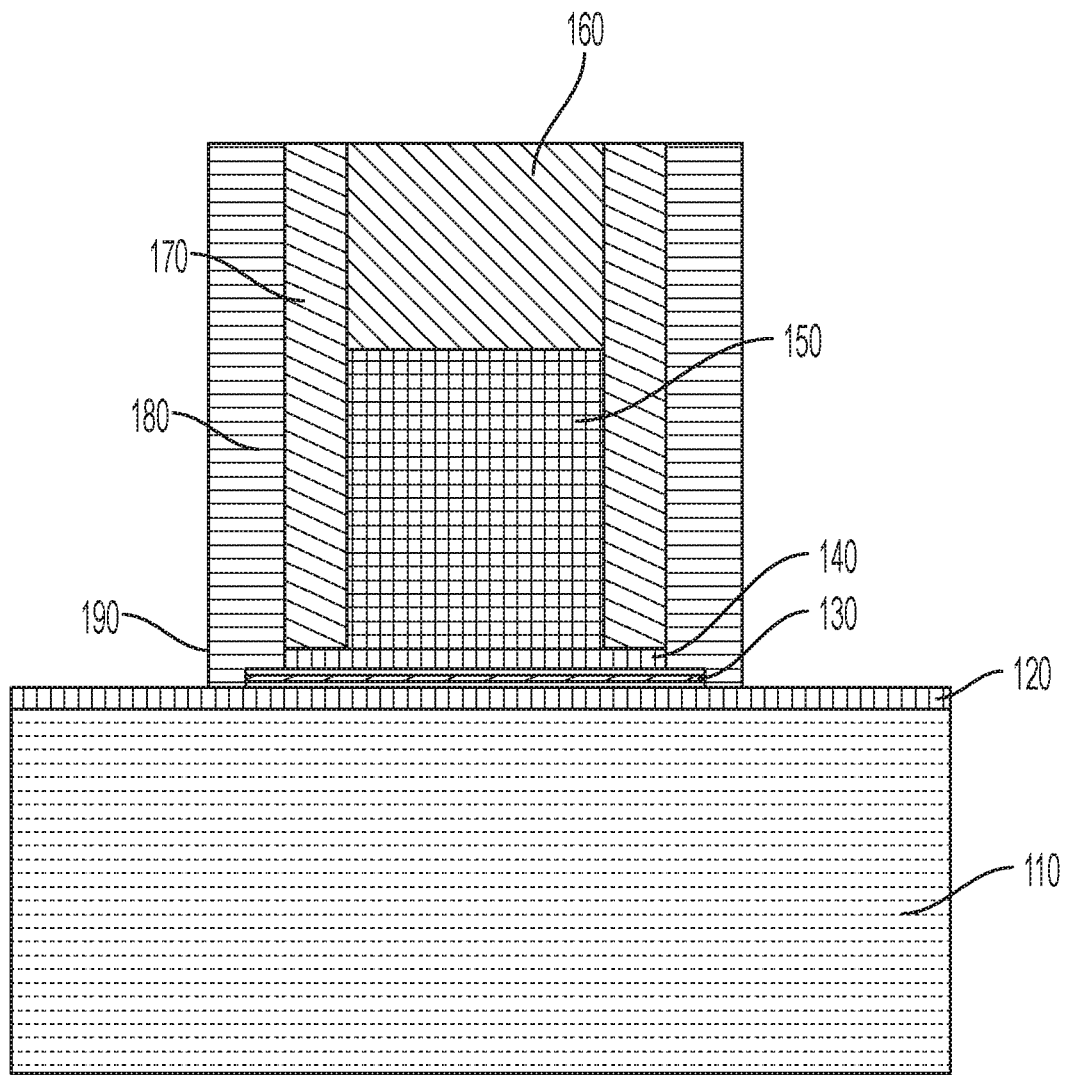
FIG. 6 depicts a cross-sectional view of the semiconductor device after fabrication operations according to embodiments of the invention.

In FIG. 6, an optional process of forming a third set of spacers 190 around the top gate 150 after removal of the exposed 2D material layer 130 is sown. The optional third set of spacers 190 can be configured to protect the 2D material layer 130 from down-stream processes. The first set of spacers 170 and/or the second set of spacers 180 and/or the optional third set of spacers 190 can include silicon nitride (SiN), oxide, SiBCN, and/or SiOCN.

Figure 7:
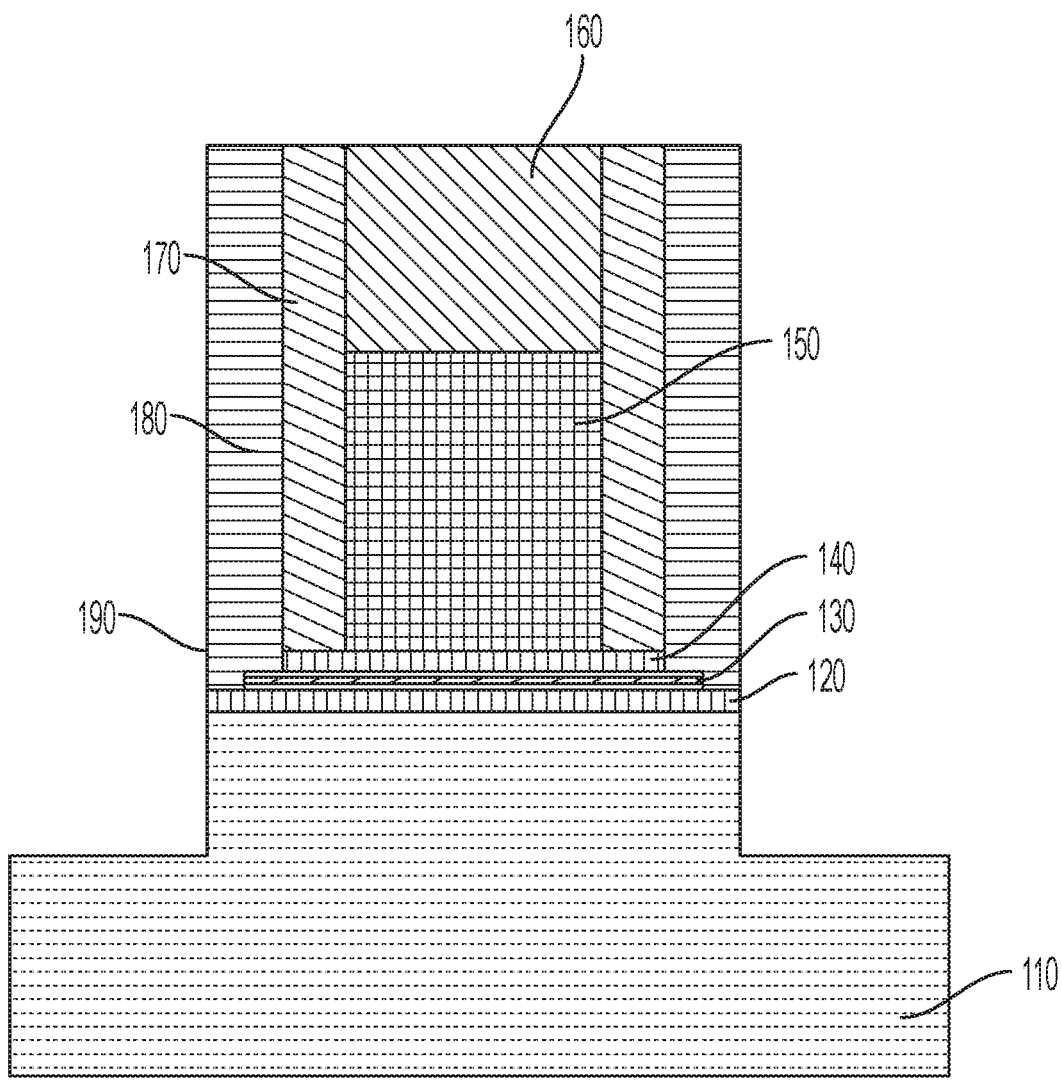
FIG. 7 depicts a cross-sectional view of the semiconductor device after fabrication operations according to embodiments of the invention.
Figure 8:
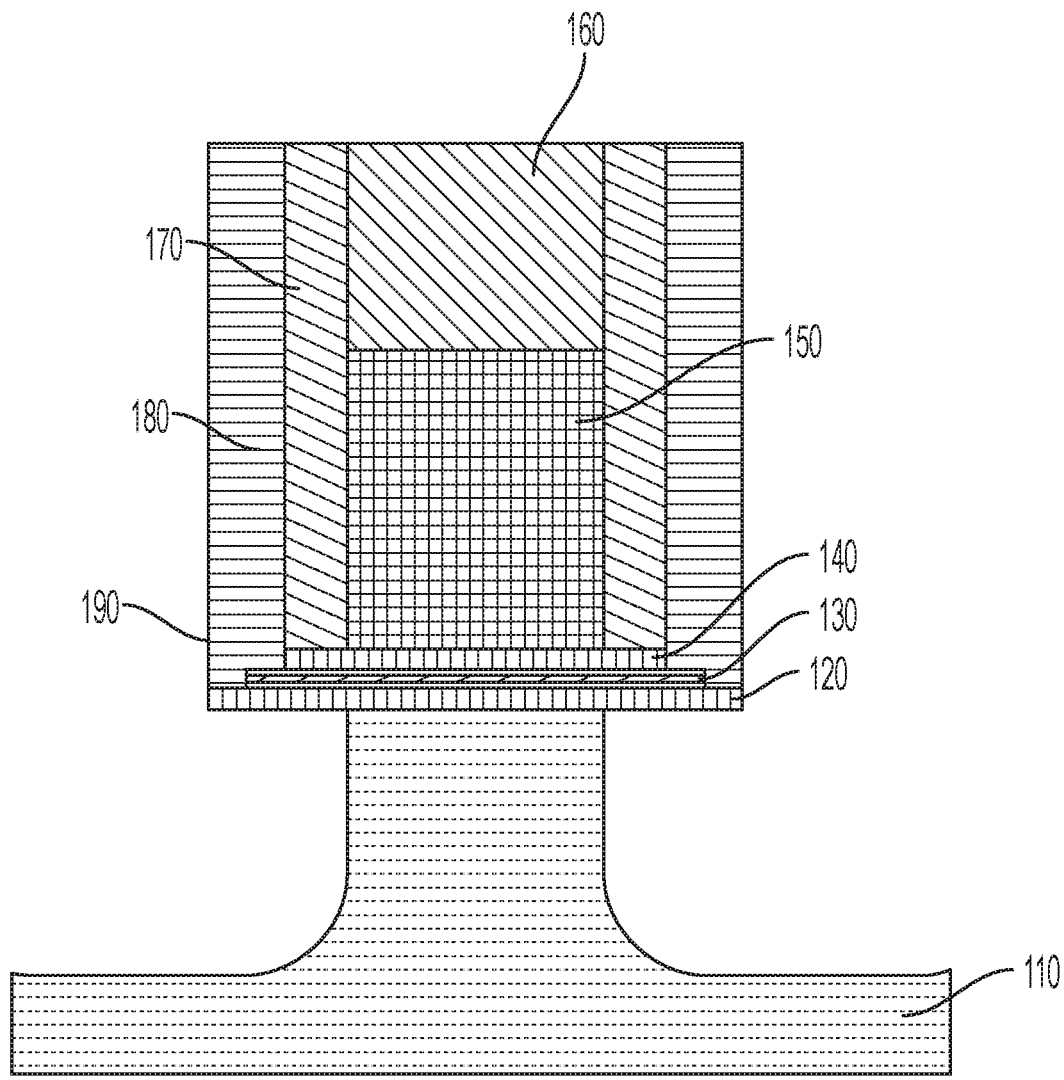
FIG. 8 depicts a cross-sectional view of the semiconductor device after fabrication operations according to embodiments of the invention.

In FIG. 7, a directional etch down of the substrate 110 has occurred, while in FIG. 8, a lateral isotropic etch of the substrate 110 is performed. The target etch thickness can be equal to the total spacer thickness, which can be 2.5 nanometers (nm) to 20 nm, for example, 4 nm to 15 nm, for example, 5 nm to 12 nm. The lateral isotropic etch can be a self-limited etch process such as an atomic layer etch.

Figure 9:
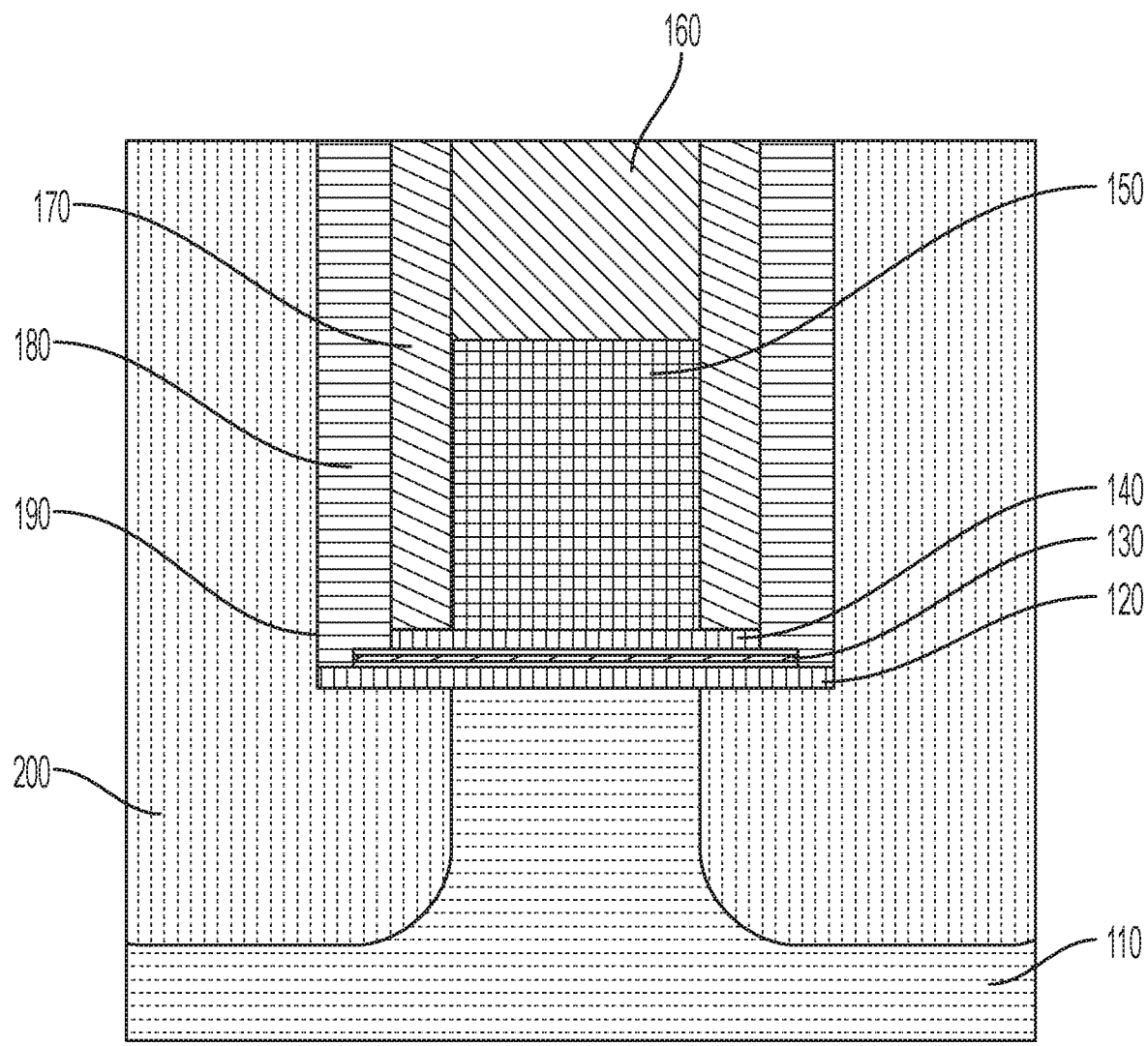
FIG. 9 depicts a cross-sectional view of the semiconductor device after fabrication operations according to embodiments of the invention.

In FIG. 9, open spaces are filled with a dielectric material 200 surrounding the top gate 150, the back gate dielectric 120, and the substrate 110. The dielectric material 200 filling the spaces is a low k dielectric material such as silicon oxide. Low-k generally refers to materials having a k value smaller than that of SiN, which generally means smaller than 7.

Figure 10:
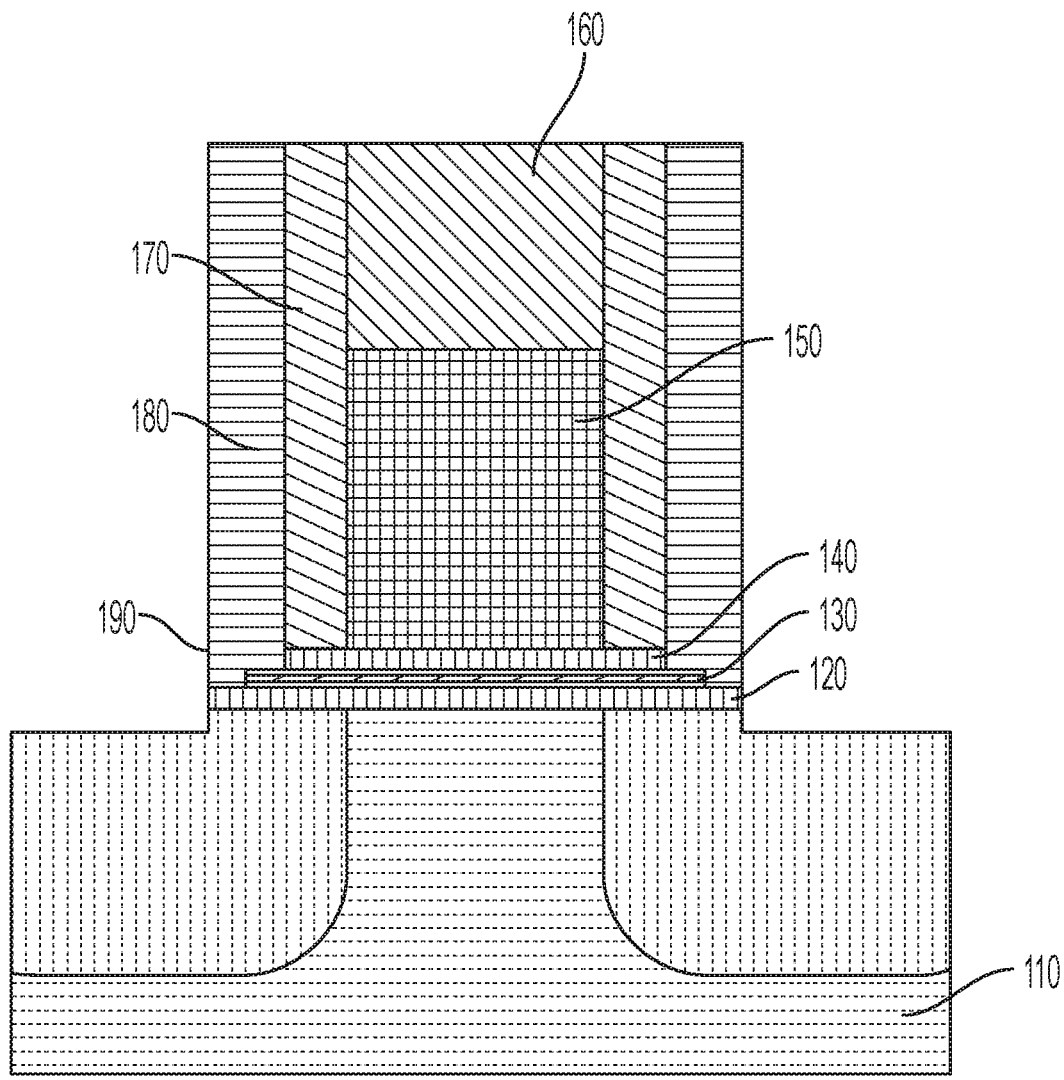
FIG. 10 depicts a cross-sectional view of the semiconductor device after fabrication operations according to embodiments of the invention.
Figure 11:
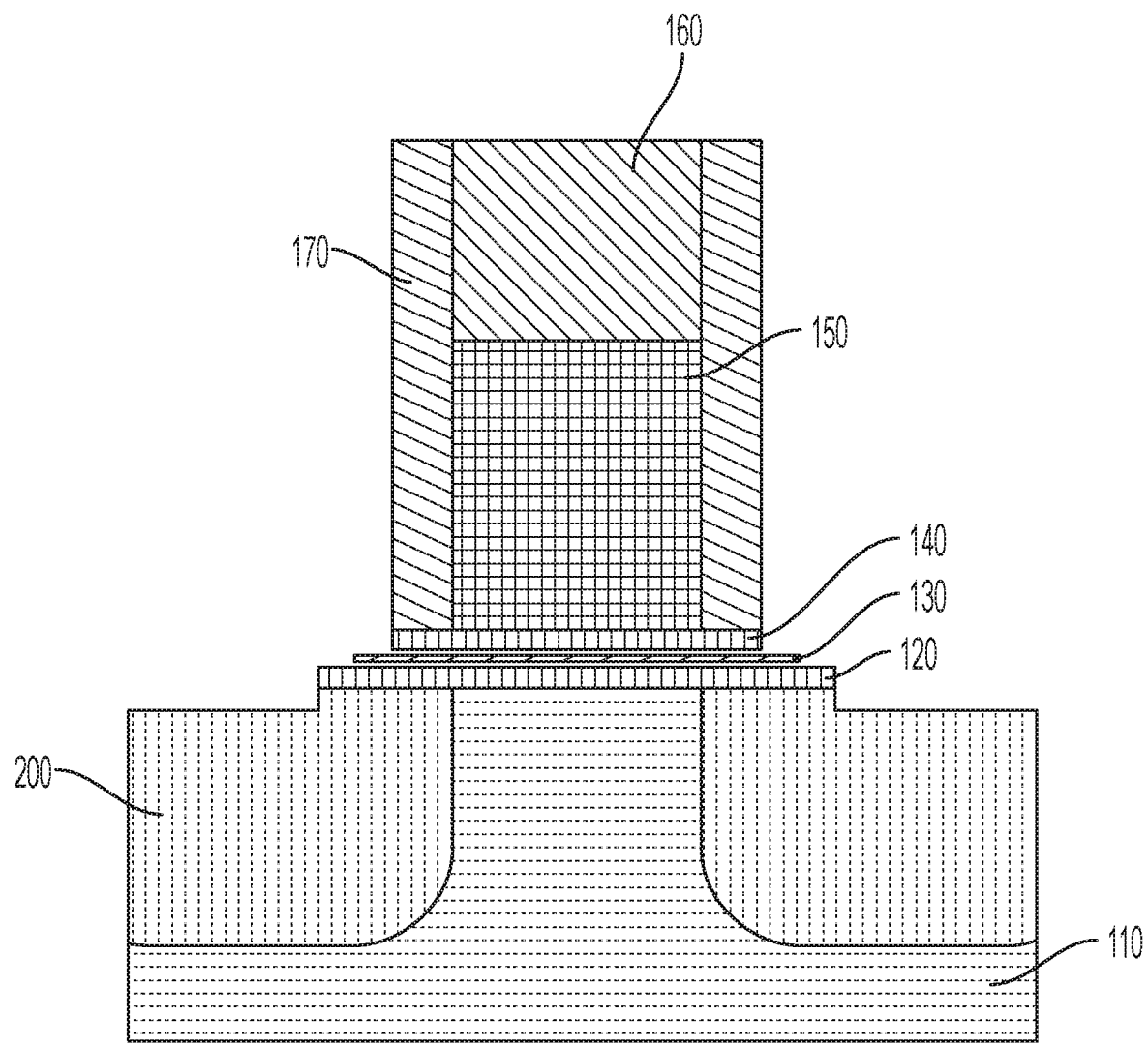
FIG. 11 depicts a cross-sectional view of the semiconductor device after fabrication operations according to embodiments of the invention.
Figure 12:
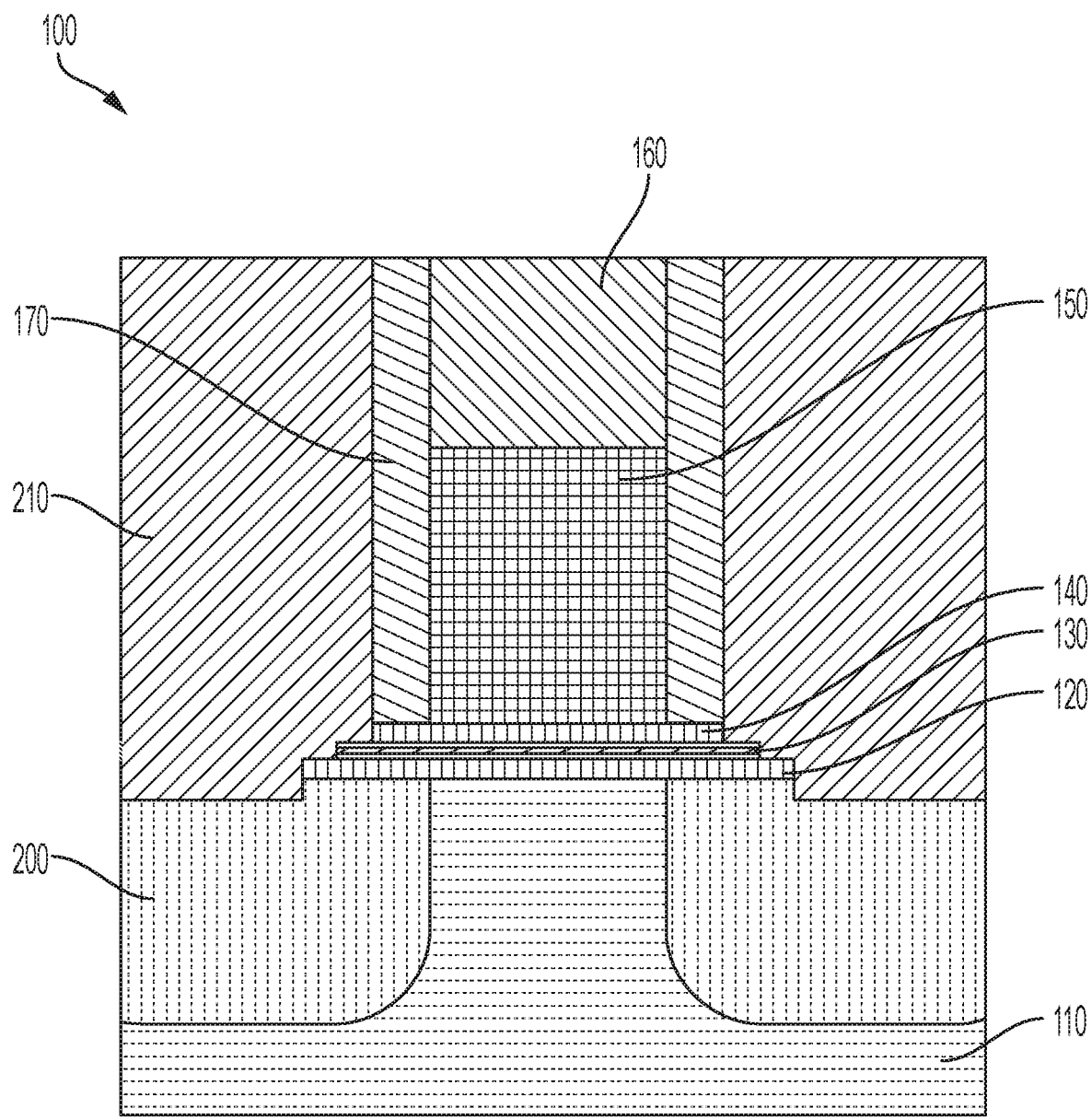
FIG. 12 depicts a cross-sectional across the gate view of the semiconductor device after fabrication operations according to embodiments of the invention.

In FIG. 10, the dielectric material 200 is etching from the top gate 150 and the back gate dielectric 120. In FIG. 11, the second set of spacers 180 and the optional third set of spacers 190 have been removed. In FIG. 12, the source and drain contact metal has been deposited 210 such that the source and drain contact metal contacts an edge of the layer of the 2D material layer 130 forming the semiconductor device 100.

In the structure shown in FIG. 12, the source and drain contact metal 210 mainly contacts the edge of the 2D material layer 130 and not the surface. Edge contact to 2D materials has an advantage of improved contact resistivity compared to surface contact.

Figure 13:
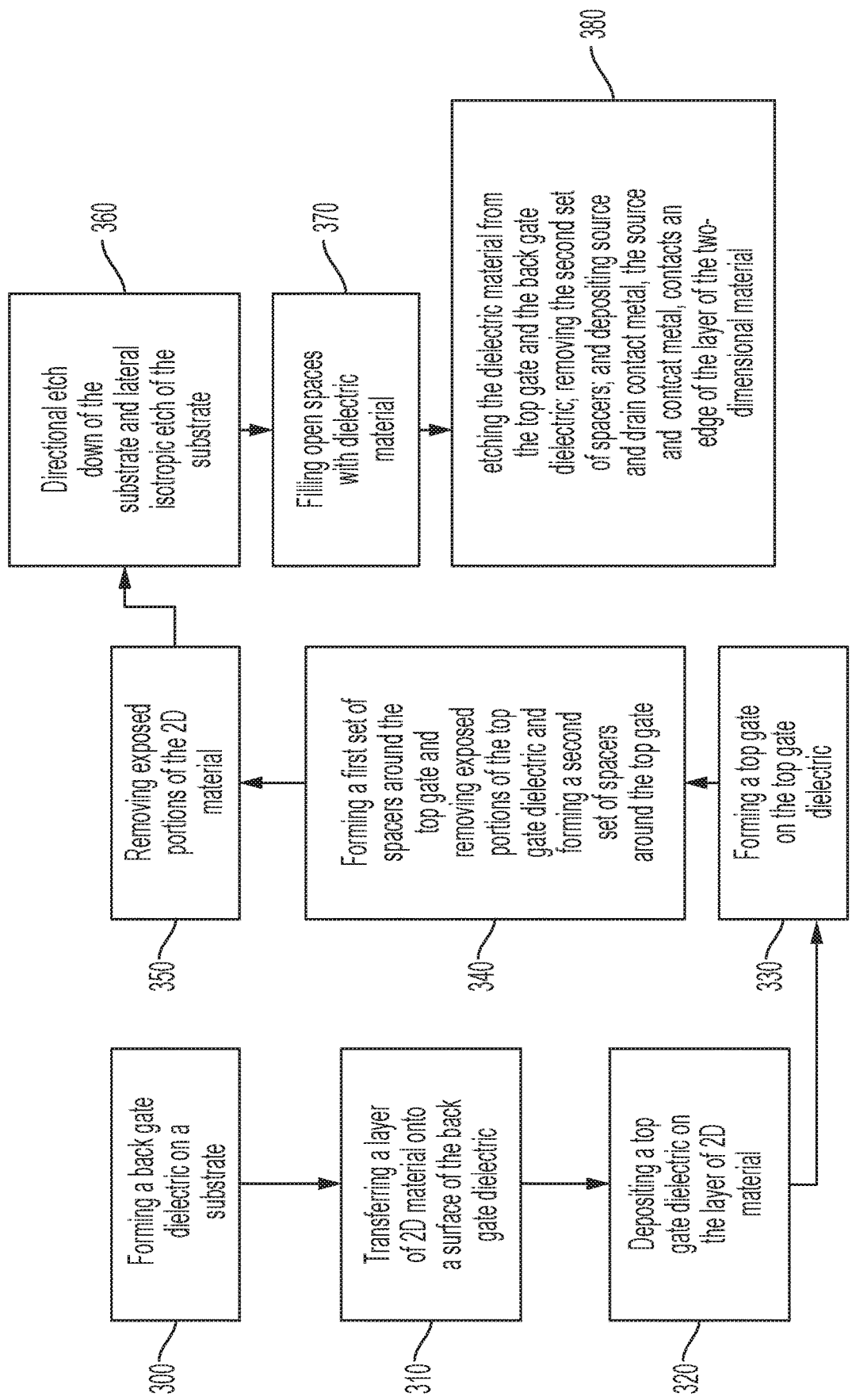
FIG. 13 depicts a flow diagram illustrating a method according to embodiments of the invention.

FIG. 13 is a depiction of a flow diagram illustrating a method according to one or more embodiments of the invention. In FIG. 13, at 300, a back gate dielectric is formed on a substrate. At 310, a layer of 2D material is transferred onto a surface of the back gate dielectric, while at 320, a top gate dielectric is deposited on the layer of 2D material. At 330, a top gate is formed on the gate dielectric. At 340, a first set of spacers is formed around the top gate and exposed portions of the top gate dielectric are removed and a second set of spacers formed around the top gate. At 350, exposed portions of the 2D material are removed. At 360, a directional etch down of the substrate is performed and then a lateral isotropic etch of the substrate is performed. At 370, open spaces are filled with dielectric material surrounding the top gate, the back gate dielectric, and the substrate. At 380, the dielectric material and etched from the top gate and the back gate dielectric, the second set of spacers is removed, and the source and drain contact metal are deposited. The source and drain contact metal contacts an edge of the layer of the two-dimensional material.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
forming a back gate dielectric on a substrate; transferring a layer of two-dimensional material onto a surface of the back gate dielectric; depositing a top gate dielectric on the layer of two-dimensional material; forming a top gate on the top gate dielectric; forming a first set of spacers around the top gate; removing exposed portions of the top gate dielectric and forming a second set of spacers at the location where the portions of the top gate dielectric were removed and around the top gate; removing exposed portions of the two-dimensional material; performing a directional etch down of the substrate and performing a lateral isotropic etch of the substrate; filling open spaces with a dielectric material surrounding the top gate, the back gate dielectric, and the substrate; etching the dielectric material from the top gate and the back gate dielectric; removing the second set of spacers; and depositing source and drain contact metal, wherein the source and drain contact metal contacts an edge of the layer of the two-dimensional material.

2. The method of claim 1, wherein the substrate comprises a highly doped substrate including a dopant concentration that is greater than $1\times10^{19}$ cm$^3$.

3. The method of claim 1, wherein the substrate comprises a conductive substrate or an insulator substrate with a conductive material.

4. The method of claim 1, further comprising forming a protective layer on a surface of the top gate.

5. The method of claim 4, wherein the protective layer comprises silicon nitride.

6. The method of claim 1, further comprising forming a third set of spacers around the top gate after removal of the exposed two-dimensional material, wherein the third set of spacers is configured to protect the two-dimensional material from down-stream processes.

7. The method of claim 1, wherein the etch thickness of the lateral isotropic etch is about equal to the total spacer thickness.

8. The method of claim 1, wherein lateral isotropic etch comprises an atomic layer etch.

9. The method of claim 1, wherein the dielectric material filling the spaces comprises a low-k dielectric material.

10. The method of claim 9, wherein the low-k dielectric material comprises silicon oxide.

11. The method of claim 1, wherein the two-dimensional material comprises a monolayer of atoms having a thickness of less than 1 millimeter.

\* \* \* \* \*